(12) United States Patent
Nakagawa et al.

(10) Patent No.: US 7,915,131 B2
(45) Date of Patent: Mar. 29, 2011

(54) SEMICONDUCTOR DEVICE AND METHOD FOR FABRICATING THE SAME

(75) Inventors: Ryo Nakagawa, Osaka (JP); Takayuki Yamada, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/914,026

(22) Filed: Oct. 28, 2010

(65) Prior Publication Data
US 2011/0039379 A1    Feb. 17, 2011

Related U.S. Application Data

(62) Division of application No. 12/141,530, filed on Jun. 18, 2008, now Pat. No. 7,843,013.

(30) Foreign Application Priority Data

Jul. 27, 2007    (JP) ................................ 2007-196287

(51) Int. Cl.
H01L 21/336    (2006.01)
H01L 21/8238    (2006.01)
H01L 21/76    (2006.01)

(52) U.S. Cl. ........ 438/300; 438/429; 438/223; 438/210; 257/E21.409

(58) Field of Classification Search .................. 438/300, 438/429, 223, 210; 257/E21.409
See application file for complete search history.

(56) References Cited

U.S. PATENT DOCUMENTS

| | | | |
|---|---|---|---|
| 6,040,610 A * | 3/2000 | Noguchi et al. | 257/392 |
| 6,573,172 B1 | 6/2003 | En et al. | |
| 6,797,556 B2 * | 9/2004 | Murthy et al. | 438/231 |
| 6,891,192 B2 * | 5/2005 | Chen et al. | 257/49 |
| 7,112,495 B2 | 9/2006 | Ko et al. | |
| 7,402,865 B2 | 7/2008 | Ipposhi et al. | |
| 7,407,860 B2 | 8/2008 | Kim et al. | |
| 7,408,218 B2 | 8/2008 | Akiyama et al. | |
| 7,414,292 B2 | 8/2008 | Ema et al. | |
| 7,586,158 B2 | 9/2009 | Hierlemann et al. | |
| 7,646,068 B2 | 1/2010 | Ko et al. | |
| 2005/0181626 A1 * | 8/2005 | Hori | 438/775 |
| 2005/0227440 A1 * | 10/2005 | Ema et al. | 438/275 |
| 2007/0090417 A1 * | 4/2007 | Kudo | 257/288 |
| 2008/0003734 A1 | 1/2008 | Chuang et al. | |

OTHER PUBLICATIONS

Ota, K. et al., "Novel Locally Strained Channel Technique for High Performance 55nm CMOS," IDEM 2002, p. 27.
Ortolland, C. et al., "Stress Memorization Technique (SMT) Optimization for 45nm CMOS,"VLSI 2006, p. 96-97.

* cited by examiner

Primary Examiner — Luan C Thai
(74) Attorney, Agent, or Firm — McDermott Will & Emery LLP

(57) ABSTRACT

A semiconductor device includes: an isolation region formed in a semiconductor substrate; active regions surrounded by the isolation region and including p-type and n-type regions, respectively; an NMOS transistor formed in the active region including the p-type region and including an n-type gate electrode; a PMOS transistor formed in the active region including the n-type region and including a p-type gate electrode; and a p-type resistor formed on the isolation region. The p-type resistor has an internal stress greater than that of the p-type gate electrode.

10 Claims, 3 Drawing Sheets

SEMICONDUCTOR DEVICE AND METHOD FOR FABRICATING THE SAME

RELATED APPLICATIONS

This application is a Divisional of U.S. patent application Ser. No. 12/141,530, filed on Jun. 18, 2008, now U.S. Pat. No. 7,843,013 claiming priority of Japanese Patent Application No. 2007-196287, filed on Jul. 27, 2007, the entire contents of each of which are hereby incorporated by reference.

BACKGROUND OF THE INVENTION (1) Field of the Invention

The present invention relates to semiconductor devices including, for example, resistors and methods for fabricating the same.

(2) Disclosure of Related Art

With recent development of information communication equipment, semiconductor devices such as system large scale integration (LSI) are required to have high processing ability. To meet this requirement, transistors have been designed to operate at higher speed. In particular, complementary field-effect transistors (FETs) composed of n-channel metal oxide semiconductor (NMOS) and p-channel metal oxide semiconductor (PMOS) transistors are widely used because of their low power consumption. Increase in speed of the complementary FETs has been achieved mainly by downsizing the structures thereof and is supported by development of lithography for processing semiconductor elements. However, in recent years, the required minimum processing dimensions come to be equal to or smaller than the wavelength level of light used in lithography. Therefore, further miniaturization becomes more difficult.

In view of this, techniques for enhancing the device performance of transistors without the need for size reduction are demanded. One of the techniques is a strained silicon technique for changing carrier mobility by deforming the crystal structure of silicon. Transistors employing the strained silicon technique may have larger carrier mobility than transistors made of bulk silicon, and thus NMOS and PMOS transistors are allowed to have higher current driving abilities. Therefore, for devices employing the strained silicon technique, device performance is enhanced without reduction of device size.

As such a technique for forming strained silicon, a stress memorization technique (SMT) is proposed in, for example, K. Ota et al., IEDM 2002, p 27. Specifically, in the SMT, an isolation region, a gate insulating film and a gate electrode are formed in/on a semiconductor substrate, and then ion implantation is performed on an extension region and source/drain regions. Thereafter, an SMT film is deposited over the semiconductor substrate and is subjected to annealing, thereby causing stress from the SMT film to be memorized in a channel region. As the SMT film, a laminated film in which an underlying film made of a silicon oxide film and a stressor film made of a silicon nitride film and having tensile stress are stacked in this order is generally used. Though this SMT film is removed after the annealing, the stress memorized in the channel region remains after the removal of the SMT film. Accordingly, in an NMOS transistor, mobility of electrons increases so that the current driving ability is enhanced.

Complementary metal oxide semiconductor (CMOS) transistors are composed of NMOS transistors and PMOS transistors and it is desirable that both types of transistors have high current driving abilities. However, as reported in, for example, C. Ortolland et al., VLSI 2006, pp.96-97, the use of an SMT causes the current driving ability to deteriorate for PMOS transistors. This document shows the reason for deterioration of current driving ability of a PMOS transistor is that annealing performed with the PMOS transistor covered with an SMT film causes the activation rate of boron (B) as a p-type impurity to decrease. Specifically, when the transistor is covered with a silicon nitride film serving as a stressor film, hydrogen in a silicon oxide film serving as an underlying film is not diffused toward the outside of a semiconductor substrate during annealing. This seems to result in a decrease in activation rate of boron (B) contained in the semiconductor substrate. In view of this, to prevent deterioration of current driving ability of the PMOS transistor, the process of removing the silicon nitride film on the PSMOS transistor and then performing annealing with only the NMOS transistor covered with the SMT film is effective.

SUMMARY OF THE INVENTION

On the other hand, the present inventors studied the relationship between the SMT film and the activation rate of boron (B) during annealing in further detail to find that the decrease in activation rate of B is caused not only by hydrogen in the silicon oxide film but also by hydrogen in the silicon nitride film. In addition, even if the silicon nitride film formed on the B-doped active region (i.e., $p^+$ region) is removed, the presence of the silicon nitride film remaining on another region of the semiconductor substrate causes the activation rate of B to decrease. It is also found that the larger the amount of the silicon nitride film formed on the semiconductor substrate is, the greater the decrease in activation rate of B is.

FIG. 3 is a graph showing a relationship between the amount of the silicon nitride film deposited over the semiconductor substrate and the resistance of the $p^+$ region. The resistance of the $p^+$ region is normalized to have the maximum value at one (1) and is represented as a rate of change to the maximum value. The resistance of the $p^+$ region indicates a resistance of an unsilicided $p^+$ region when annealing is performed with variations of the amount of the silicon nitride film deposited over the semiconductor substrate. To determine only how hydrogen contained in the silicon nitride film affects the $p^+$ region, annealing is performed with the $p^+$ region covered with the silicon oxide film. As shown in FIG. 3, as the amount of the silicon nitride film over the semiconductor substrate increases, the resistance of the $p^+$ region increases. This shows that the larger the amount of the deposited silicon nitride film is, the greater the degradation of the activation rate of B is. From the foregoing results, it can be concluded that the $p^+$ resistance varies depending on the area of the SMT film formed over the semiconductor substrate and the distance from the $p^+$ region to the SMT film.

On a region including a $p^+$ resistor formed by implanting a p-type impurity in, for example, polysilicon, annealing is conventionally performed with not only part of the SMT film over the PMOS transistor area but also part of the SMT film over the $p^+$ resistor removed, in order to eliminate the necessity of consideration of mask alignment. The present inventors found that such annealing causes the resistance of the resistor, such as an analog resistor, incorporated in system LSI to vary depending on the layout of the SMT film. Since automation of design of analog circuits is not advanced as compared to digital circuit, the time necessary for development thereof relatively increases as the device size is reduced. Under such circumstances, it is a serious problem that the resistance of the resistor varies depending on the layout of the SMT film so that no desired characteristics are obtained.

It is therefore an object of the present invention to provide a semiconductor device which is operable at high speed and includes a resistor exhibiting a small range of variation in resistance and having excellent characteristics irrespective of the layout of an SMT film and a method for fabricating such a semiconductor device.

To solve the problem described above, a semiconductor device according to the present invention includes: a semiconductor substrate; an isolation region formed in the semiconductor substrate; a first active region defined in the semiconductor substrate and surrounded by the isolation region; a second active region defined in the semiconductor substrate and surrounded by the isolation region; an NMOS transistor formed in the first active region and including an n-type gate electrode made of silicon doped with an n-type impurity; a first PMOS transistor formed in the second active region and including a first p-type gate electrode made of silicon doped with a p-type impurity; and a p-type resistor formed on the isolation region, made of silicon doped with a p-type impurity, and having an internal stress greater than that of the first p-type gate electrode.

With this structure, the p-type resistor on the semiconductor substrate has a uniform internal stress greater than that of the first p-type gate electrode, so that variation in activation rate of the p-type impurity contained in the p-type resistor is small in the same semiconductor substrate. Accordingly, the range of variation in resistivity of the p-type resistor is also small, thus implementing a semiconductor device which includes a resistor exhibiting excellent characteristics and is operable at high speed.

The NMOS transistor may include a first metal silicide film formed on the n-type gate electrode, and no metal silicide films are not necessarily formed on the first p-type gate electrode and the p-type resistor.

In this case, the first metal silicide film is formed on the n-type gate electrode to reduce the contact resistance between the n-type gate electrode and a contact. Accordingly, the driving ability of the semiconductor device is further enhanced.

The p-type impurity contained in the first p-type gate electrode may have an activation rate higher than that of the p-type impurity contained in the p-type resistor. In this case, a rise in resistance of the gate electrode is suppressed and a resistor having a relatively-high resistivity is provided. Therefore, the driving ability of the semiconductor device is further enhanced.

A method for fabricating a semiconductor device according to the present invention includes the steps of: (a) defining an isolation region, a first active region and a second active region in a semiconductor substrate, and then depositing a gate insulating film and a gate electrode film made of silicon over the entire surface of the semiconductor substrate; (b) implanting an n-type impurity in part of the gate electrode film located above the first active region and implanting a p-type impurity in part of the gate electrode film located above the second active region and the isolation region; (c) patterning the gate insulating film and the gate electrode film, thereby forming an n-type gate electrode and a first p-type gate electrode above the first active region and the second active region, respectively, with the gate insulating film interposed therebetween, and forming a p-type resistor above the isolation region, after step (b); (d) forming a stressor film which covers the n-type gate electrode and the p-type resistor and applies tensile stress, along a gate length, to a channel region of the first active region; (e) heating the semiconductor substrate, thereby causing the tensile stress applied from the stressor film to be memorized in the p-type resistor and a surface part of the first active region as internal stress; and (f) removing the stressor film, after step (e).

With this method, in steps (c) and (d), the stressor film is provided not only on the n-type gate electrode but also on the p-type resistor for heat treatment. This allows tensile stress of the stressor film to be uniformly applied to the p-type resistor. Accordingly, the activation rate of the p-type impurity contained in the p-type resistor does not greatly change depending on the layout of the stressor film, such as the area of the stressor film on the semiconductor substrate, thus obtaining a resistor having a small range of variation in activation rate. Therefore, the method for fabricating a semiconductor device of the present invention enables relatively-easy fabrication of a resistor which is required to operate with high accuracy, such as an analog resistor.

DETAILED DESCRIPTION OF THE INVENTION

Embodiment

Hereinafter, a semiconductor device and a method for fabricating the device according to an embodiment of the present invention will be described with reference to FIGS. 1A through 1F. FIGS. 1A through 1F are cross-sectional views illustrating a method for fabricating a semiconductor device according to this embodiment. Now, the method for fabricating a semiconductor device of this embodiment is described.

Figure 1A:
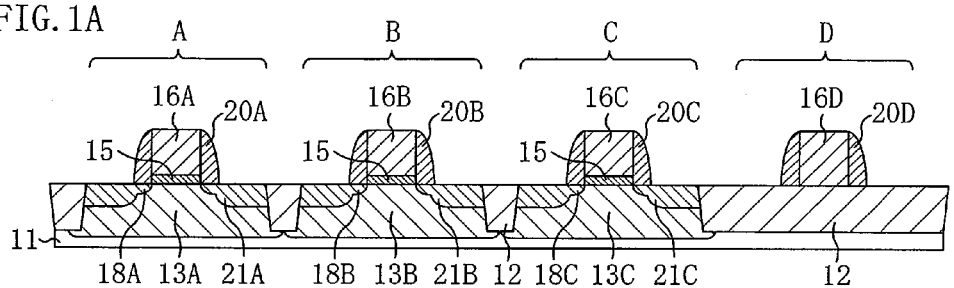
FIGS. 1A through 1F are cross-sectional views showing process steps for fabricating a semiconductor device according to an embodiment of the present invention.

First, as illustrated in FIG. 1A, an isolation region 12 is formed in a semiconductor substrate 11 by, for example, shallow trench isolation (STI). Then, given regions of the semiconductor substrate 11 are doped with p- and n-type impurities, thereby defining an active region 13A surrounded by the isolation region 12 and including a p-type region and active regions 13B and 13C surrounded by the isolation region 12 and including n-type regions. As illustrated in FIG. 1A, the semiconductor device of this embodiment includes: an NMOS transistor area A; PMOS transistor areas B and C; and a p-type resistor area D.

Next, a gate insulating film 15 having a thickness of, for example, 2 nm and made of a silicon oxide film and a gate electrode film having a thickness of, for example, 100 nm and made of polysilicon are stacked in this order over the entire surface of the semiconductor substrate 11. Then, part of the gate electrode film located in the NMOS transistor area A is doped with ions of an n-type impurity such as arsenic (As) at a dose of $6 \times 10^{15}$ cm$^{-2}$, whereas part of the gate electrode film located in the PMOS transistor areas B and C and the p-type resistor area D is doped with ions of a p-type impurity such as boron (B) at a dose of $2 \times 10^{15}$ cm$^{-2}$. Thereafter, patterning is performed on the gate electrode film and the gate insulating film 15, thereby forming an n-type gate electrode 16A above the active region 13A in the NMOS transistor area A with the gate insulating film 15 interposed therebetween, p-type gate electrodes 16B and 16C above the active regions 13B and 13C in the PMOS transistor areas B and C, respectively, with the gate insulating film 15 interposed therebetween, and a p-type resistor 16D on the isolation region 12 in the p-type resistor area D.

Then, the active region 13A is doped with ions of an n-type impurity such as As using the n-type gate electrode 16A as a mask, thereby defining an n-type extension region 18A. In the same manner, the active regions 13B and 13C are doped with ions of a p-type impurity such as $BF_2$ using the p-type gate electrodes 16B and 16C as masks, thereby defining p-type extension regions 18B and 18C, respectively.

Subsequently, sidewall films 20A, 20B, 20C and 20D made of, for example, silicon nitride are formed on side faces of the n-type gate electrode 16A, the p-type gate electrodes 16B and 16C and the p-type resistor 16D, respectively. Thereafter, in the NMOS transistor area A, the active region 13A is doped with an n-type impurity such as P or As using the n-type gate electrode 16A and the sidewall film 20A as masks, thereby defining n-type source/drain regions 21A. In the same manner, in the PMOS transistor areas B and C, the active regions 13B and 13C are doped with a p-type impurity such as B, thereby defining p-type source/drain regions 21B and 21C, respectively. In defining the n-type source/drain regions 21A, the n-type extension region 18A, the p-type source/drain regions 21B and 21C and the p-type extension regions 18B and 18C, the p-type resistor 16D is covered with a mask so as to prevent contamination of an impurity.

Figure 1B:
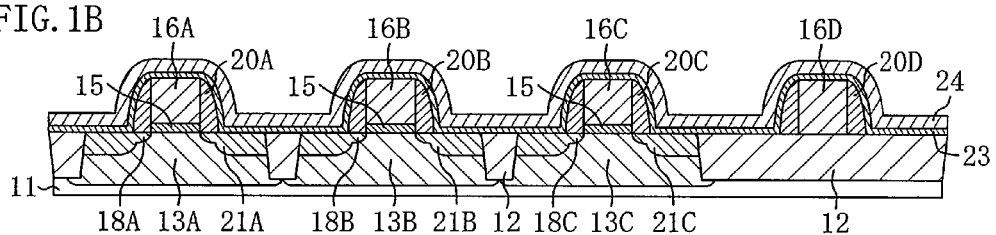

Then, as illustrated in FIG. 1B, an underlying insulating film 23 having a thickness of, for example, 10 nm and made of silicon oxide is formed by, for example, chemical vapor deposition (CVD) over the entire surface of the semiconductor substrate 11. Subsequently, a stressor film 24 having a thickness of, for example, 50 nm and made of silicon nitride is formed by, for example, plasma CVD over the underlying insulating film 23. The stressor film 24 applies tensile stress to the channel region of the active region 13A along the gate length.

Figure 1C:
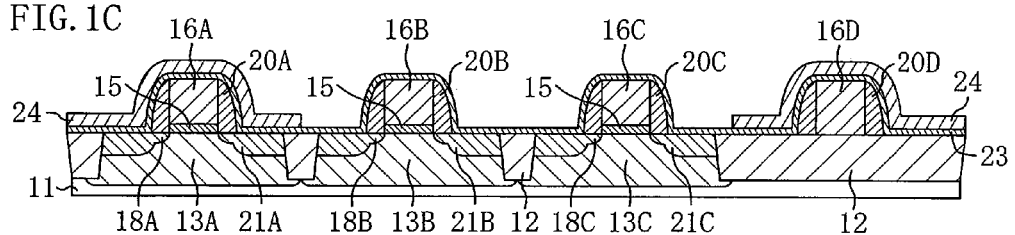

Thereafter, as illustrated in FIG. 1C, part of the stressor film 24 formed in the PMOS transistor areas B and C is selectively removed with part of the stressor film 24 left in the NMOS transistor area A and the p-type resistor area D. In this process step, the stressor film 24 is selectively removed by wet etching using, for example, a hot phosphoric acid solution or dry etching. In this case, the underlying insulating film 23 preferably has a selectivity sufficiently higher than that of the stressor film 24 for excellent etching of the stressor film 24. If a silicon nitride film is used as the stressor film 24, the underlying insulating film 23 is preferably a silicon oxide film because a sufficiently high selectivity is obtained.

Subsequently, the semiconductor substrate 11 is heated by rapid thermal annealing (RTA) at a temperature of, for example, 1000° C. At this time, the impurities implanted in the extension regions and the source/drain regions formed in the process steps described above are activated. In this process step, tensile stress of the stressor film 24 is memorized in the p-type resistor 16D and the channel region of the active region 13A in the NMOS transistor area A. Internal stress which stretches the channel region in the NMOS transistor area A along the gate length is also memorized in the n-type gate electrode 16A.

Figure 1D:
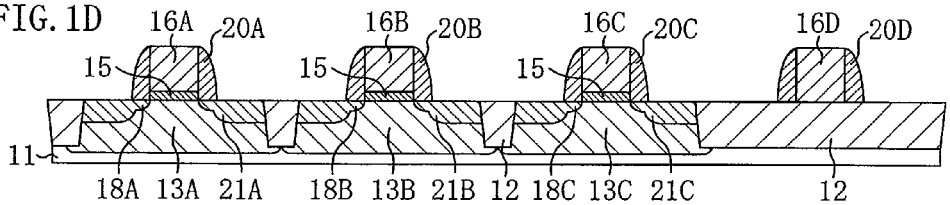

Then, as illustrated in FIG. 1D, the stressor film 24 and the underlying insulating film 23 are removed. In the same manner as in the step shown in FIG. 1C, the stressor film 24 is removed by wet etching using, for example, a hot phosphoric acid solution.

Figure 1E:
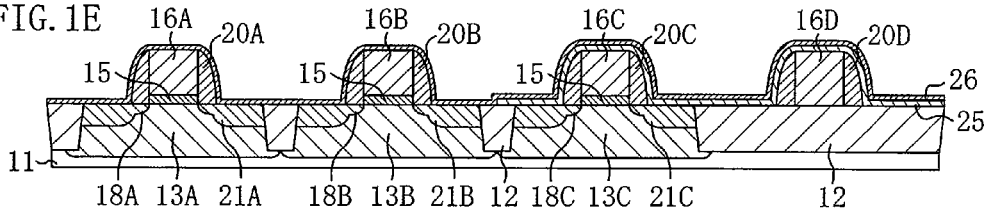

Thereafter, as illustrated in FIG. 1E, an anti-silicidation film 25 having a thickness of, for example, 10 nm and made of, for example, silicon oxide is deposited over the entire surface of the semiconductor substrate 11. After that, part of the anti-silicidation film 25 located in the NMOS transistor area A and the PMOS transistor area B is selectively removed with part of the anti-silicidation film 25 left in the PMOS transistor area C and the p-type resistor area D. Then, a metal film 26 having a thickness of, for example, 10 nm and made of Ni is deposited over the entire surface of the semiconductor substrate 11.

Figure 1F:
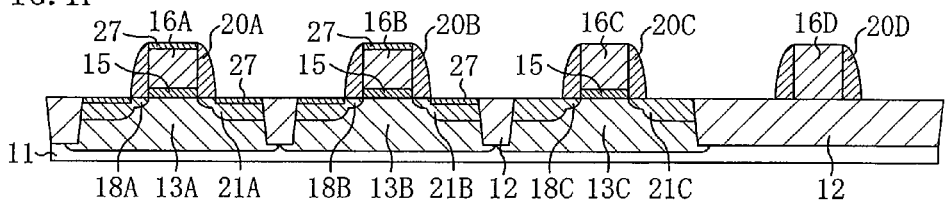

Subsequently, as illustrated in FIG. 1F, the semiconductor substrate 11 is heated, thereby forming metal silicide films 27 in upper parts of the n-type source/drain regions 21A and the n-type gate electrode 16A in the NMOS transistor area A. In the same manner, metal silicide films 27 are formed in upper parts of the p-type source/drain regions 21B and the p-type gate electrode 16B in the PMOS transistor area B. On the other hand, no metal silicide films are formed in the PMOS transistor area C and the p-type resistor area D where the anti-silicidation film 25 was formed. Then, the remaining part of the metal film 26 which was not silicided in the previous step and the anti-silicidation film 25 are removed. At this step, the anti-silicidation film 25 is not necessarily removed and may be used as an insulating film. After this step, a semiconductor device according to this embodiment is completed through given process steps.

Now, a structure of the semiconductor device of this embodiment is briefly described with reference to FIG. 1F. In the semiconductor device of this embodiment, types of the impurities, materials of the films and process steps for fabricating the device are already set forth above and thus descriptions thereof are herein omitted.

As illustrated in FIG. 1F, the semiconductor device of this embodiment includes: the isolation region 12 defined in the semiconductor substrate 11; the active regions 13A, 13B and 13C defined in the semiconductor substrate 11 and surrounded by the isolation region 12; an NMOS transistor formed in the active region 13A; a PMOS transistor formed in the active region 13B; a PMOS transistor formed in the active region 13C; and the p-type resistor 16D formed on the isolation region 12.

The NMOS transistor includes: the n-type gate electrode 16A formed above the active region 13A with the gate insulating film 15 interposed therebetween; the n-type extension region 18A formed at the side of the n-type gate electrode 16A in the active region 13A; the sidewall 20A formed on side faces of the n-type gate electrode 16A; the n-type source/drain regions 21A defined in the active region 13A and located at the outside of the sidewall 20A; and the metal silicide films 27 formed on the n-type gate electrode 16A and the n-type source/drain regions 21A. The PMOS transistor (first PMOS transistor) includes: the p-type gate electrode 16C formed above the active region 13C with the gate insulating film 15 interposed therebetween; the p-type extension region 18C formed at the side of the p-type gate electrode 16C in the active region 13C; the sidewall 20C formed on side faces of the p-type gate electrode 16C; and the p-type source/drain regions 21C defined in the active region 13C and located at the outside of the sidewall 20C. The PMOS transistor (second PMOS transistor) includes: the p-type gate electrode 16B formed above the active region 13B with the gate insulating film 15 interposed therebetween; the p-type extension region 18B formed at the side of the p-type gate electrode 16B in the active region 13B; the sidewall 20B formed on side faces of the p-type gate electrode 16B; the p-type source/drain regions 21B defined in the active region 13B and located at the outside of the sidewall 20B; and the metal silicide films 27 formed on the p-type gate electrode 16B and the p-type source/drain regions 21B.

A feature of the fabrication method of this embodiment is that heat treatment is performed with the stressor film 24 provided not only over the NMOS transistor area A but also over the p-type resistor area D in the process step shown in FIG. 1C. Unlike a conventional method for fabricating a semiconductor device, this method allows tensile stress of the stressor film 24 to be uniformly applied to the p-type resistor 16D. This prevents the activation rate of the p-type impurity contained in the p-type resistor 16D from greatly changing depending on the layout of the stressor film 24, such as the area of the stressor film 24 formed over the semiconductor substrate, thus implementing a resistor with a small range of variation in activation rate. Accordingly, the resistivity of the p-type resistor 16D varies in a small range. As a result, the method for fabricating a semiconductor device of this embodiment enables relatively easy fabrication of a resistor which is required to operate with high accuracy, such as an analog resistor.

Since the p-type resistor 16D is subjected to tensile stress from the stressor film 24, the internal stress thereof is greater than that of, for example, the p-type gate electrode 16C over which the stressor film 24 is not formed at the step shown in FIG. 1C. Accordingly, the activation rate of the p-type impurity contained in the p-type resistor 16D is lower than that of the p-type impurity contained in the p-type gate electrode 16C. As a result, the resistance (resistivity) of the p-type resistor 16D is higher than that of the p-type gate electrode 16C. Accordingly, a semiconductor device in which a rise in resistance of a gate electrode is suppressed and which includes a resistor having a relatively-high resistivity is implemented. With the method for fabricating a semiconductor device of this embodiment, the metal silicide films 27 are formed on the n-type gate electrode 16A and the p-type gate electrode 16B through the process steps shown in FIGS. 1E and 1F to reduce the contact resistance between these gate electrodes and contacts, thus further enhancing the driving ability of the resultant semiconductor device.

The tensile stress from the stressor film 24 is memorized in the p-type resistor 16D to cause strain in the crystal structure of silicon in the p-type resistor 16D. Accordingly, with Raman spectroscopy, a Raman peak in the case of applying a laser beam to the p-type resistor 16D is observed at a higher wavenumber than a Raman peak in the case of applying a laser beam to, for example, the p-type gate electrode 16C.

In the process step shown in FIG. 1C, the stressor film 24 is provided in the NMOS transistor area A, whereas the stressor film 24 is not provided in the PMOS transistor areas B and C. Therefore, the current driving ability of the NMOS transistor increases without degradation of the current driving ability in the PMOS transistor areas B and C. As a result, the method for fabricating a semiconductor device of this embodiment enables implementation of, for example, a high-speed CMOS transistor including a resistor with desired characteristics.

With the fabrication method of this embodiment, the p-type resistor 16D has a relatively-high resistivity. Accordingly, in forming, for example, a p-type resistor 16D having the same resistance as in a conventional semiconductor device, the area of the p-type resistor 16D of this embodiment is allowed to be smaller than that in the conventional semiconductor device. On the other hand, in the process step of this embodiment shown in FIG. 1C, lithography alignment is performed for patterning of the stressor film 24 on the p-type resistor 16D, resulting in the necessity of increasing the area of the p-type resistor area D to secure a margin for alignment.

Figure 2A:
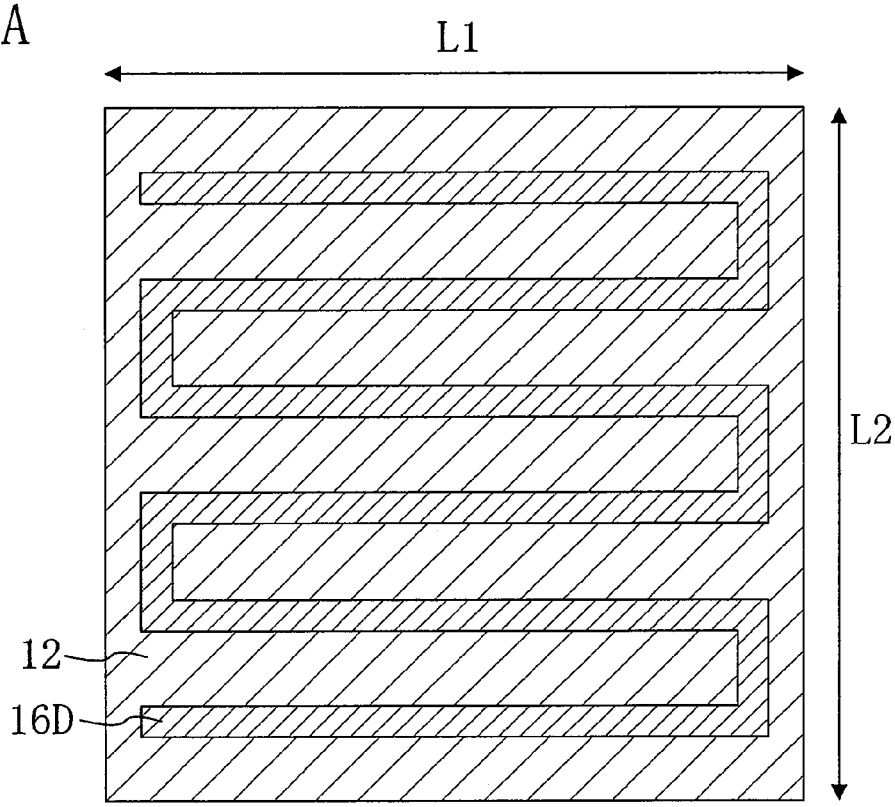
FIG. 2A is a top plan view showing a layout in the case where no stressor film 24 is formed on a p-type resistor 16D.
Figure 2B:
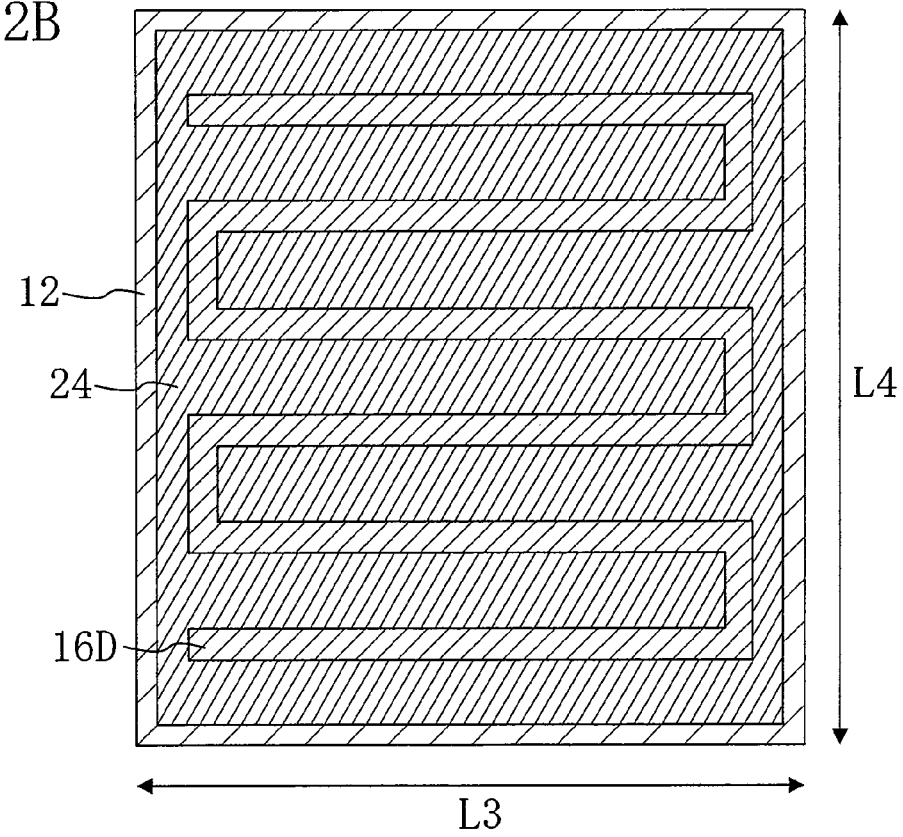
FIG. 2B is a top plan view showing a layout in the case where a stressor film 24 is formed on the p-type resistor 16D.
Figure 3:
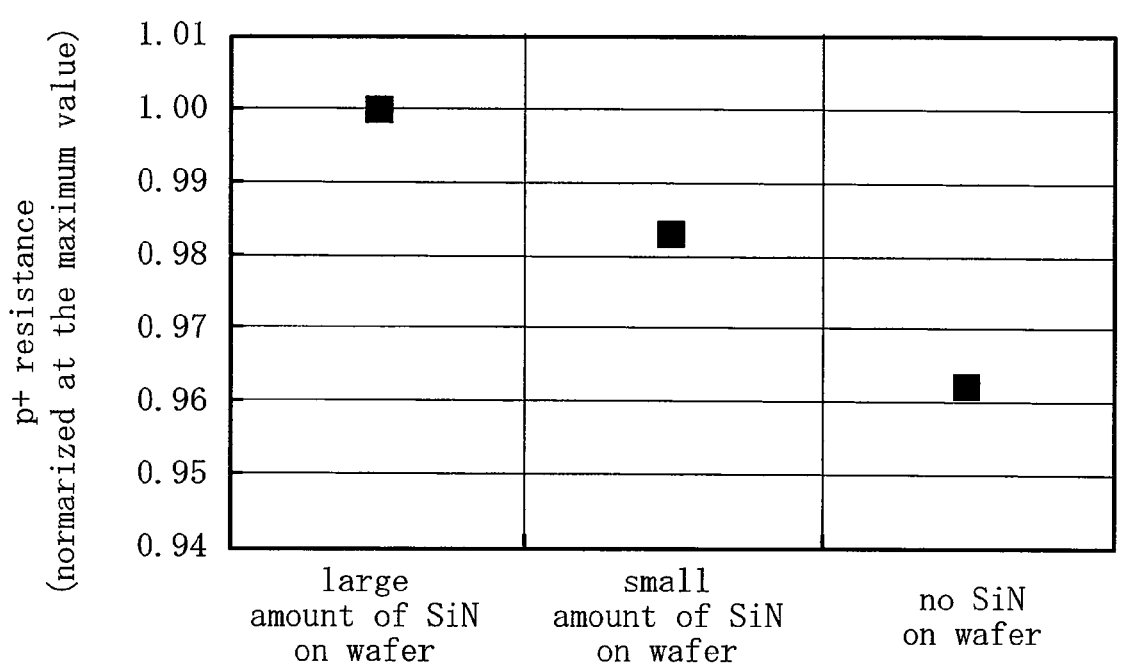
FIG. 3 is a graph showing a relationship between the amount of a silicon nitride film deposited over a semiconductor substrate and the resistance of a $p^+$ region according to the present invention.

This will be specifically described with reference to FIGS. 2A and 2B. FIG. 2A is a top plan view illustrating a layout in the case where no stressor film 24 is formed on the p-type resistor 16D. FIG. 2B is a top plan view illustrating a layout in the case where the stressor film 24 is formed on the p-type resistor 16D.

Investigations of the present inventors show that the resistivity of the p-type resistor 16D in the case of annealing performed with the p-type resistor 16D covered with the stressor film 24 is approximately 10% higher than that in the case of annealing performed with the p-type resistor 16D not covered with the stressor film 24. An alignment margin in lithography for patterning of the stressor film 24 needs to be at least 30 nm.

Accordingly, let L1 and L3 denote dimensions of the p-type resistor area D along the longitudinal direction thereof (which is herein the gate width direction of the p-type gate electrode 16C, for example) in the cases shown in FIGS. 2A and 2B, respectively, the following equation holds: L3 (nm) =0.9×L1+2×30. On the other hand, let L2 and L4 denote dimensions of the p-type resistor area D along the transverse direction thereof in the cases shown in FIGS. 2A and 2B, respectively, the following equation holds: L4 (nm)=L2+2× 30. Dimensions L2 and L4 are determined according to the minimum pitch of the p-type resistor 16D and the number of portions of the p-type resistors 16D extending in the longitudinal direction, so that reduction of the area due to increase in resistivity of the p-type resistor 16D is not taken into consideration. Accordingly, in forming a resistor having the same resistance as that in a conventional semiconductor device, as long as the area of the p-type resistor area D is, for example, 1 µm$^2$ or more, the area of the p-type resistor area D in the semiconductor device of this embodiment is allowed to be smaller than that in the conventional semiconductor device even with a margin in mask alignment for the stressor film 24 taken into consideration. As a result, a semiconductor device which includes a resistor with a relatively-high resistance and is allowed to be miniaturized is implemented.

The layouts shown in FIGS. 2A and 2B and the margin for alignment are only exemplary and the present invention is not limited to the detail described above.

For the semiconductor device and the method for fabricating a semiconductor device of this embodiment, descriptions are given on the p-type resistor 16D provided in the p-type resistor area D. However, advantages similar to those described above are obtained for, for example, resistors provided in the PMOS transistor areas B and C as long as these resistors are covered with the stressor film 24 during heat treatment. As described above, the semiconductor device and the method for fabricating a semiconductor device of this embodiment are useful for enhancing the driving ability of semiconductor devices such as system LSI.

What is claimed is:

1. A method for fabricating a semiconductor device, the method comprising the steps of:
(a) defining an isolation region, a first active region and a second active region in a semiconductor substrate, and then depositing a gate insulating film and a gate electrode film made of silicon over the entire surface of the semiconductor substrate;
(b) implanting an n-type impurity in part of the gate electrode film located above the first active region and implanting a p-type impurity in part of the gate electrode film located above the second active region and the isolation region;
(c) patterning the gate insulating film and the gate electrode film, thereby forming an n-type gate electrode and a first p-type gate electrode above the first active region and the second active region, respectively, with the gate insulating film interposed therebetween, and forming a p-type resistor above the isolation region, after step (b);

(d) forming a stressor film which covers the n-type gate electrode and the p-type resistor and applies tensile stress, along a gate length, to a channel region of the first active region;

(e) heating the semiconductor substrate, thereby causing the tensile stress applied from the stressor film to be memorized in the p-type resistor and a surface part of the first active region as internal stress; and (f) removing the stressor film, after step (e).

2. The method of claim 1, wherein step (d) includes the step of forming the stressor film over the entire surface of the semiconductor substrate, and then removing part of the stressor film located above the second active region.

3. The method of claim 1, wherein in step (e) the internal stress memorized in the p-type resistor is greater than that in the first p-type gate electrode.

4. The method of claim 1, further comprising the step of (g) forming an n-type extension region at the side of the n-type gate electrode in the first active region, and forming a p-type extension region at the side of the first p-type gate electrode in the second active region, after step (c) and before step (d).

5. The method of claim 1, further comprising the steps of:
(h) forming a fist sidewall on a side face of the n-type gate electrode and forming a second sidewall on a side face of the first p-type gate electrode; and
(i) forming n-type source/drain regions at the outside of the first sidewall in the first active region and forming p-type source/drain regions at the outside of the second sidewall in the second active region, after step (h),
wherein steps (h) and (i) are performed after step (c) and before step (d).

6. The method of claim 5, further comprising the steps of:
(j) forming an anti-silicidation film covering the first p-type gate electrode, the p-type source/drain regions and the p-type resistor, after step (i); and
(k) forming a metal silicide film on the n-type gate electrode and the n-type source/drain regions, after step (j).

7. The method of claim 6, wherein step (a) includes the step of defining a third active region in the semiconductor substrate,
step (b) includes the step of implanting a p-type impurity in part of the gate electrode film located above the third active region,
step (c) includes the step of patterning the gate insulating film and the gate electrode film, thereby forming a second p-type gate electrode above the third active region with the gate insulating film interposed therebetween,
in step (d), the stressor film does not cover the third active region, and
step (k) includes the step of forming the metal silicide film on the second p-type gate electrode.

8. The method of claim 1, wherein the stressor film is a silicon nitride film.

9. The method of claim 1, wherein in step (d), an underlying insulating film is formed on the n-type gate electrode and the p-type resistor and then the stressor film is formed on the underlying insulating film.

10. The method of claim 9, wherein the underlying insulating film is a silicon oxide film.

* * * * *